United States Patent [19]

Ueno et al.

[11] Patent Number: 5,543,286
[45] Date of Patent: Aug. 6, 1996

[54] DRY PROCESS SILVER SALT PHOTOSENSITIVE MATERIAL AND IMAGE FORMING METHOD MAKING USE OF THE DRY PROCESS SILVER SALT PHOTOSENSITIVE MATERIAL

[75] Inventors: Kazunori Ueno, Inagi; Tetsuro Fukui, Yokohama; Motokazu Kobayashi, Kawasaki; Takehiko Ooi, Sagamihara; Kenji Kagami, Atsugi; Masao Suzuki, Tokyo; Katsuya Nishino, Hiratsuka, all of Japan

[73] Assignee: Canon Kabushiki Kaisha, Tokyo, Japan

[21] Appl. No.: 338,770

[22] Filed: Nov. 10, 1994

[30] Foreign Application Priority Data

Nov. 12, 1993 [JP] Japan ................. 5-283600

[51] Int. Cl.$^6$ ................. G03C 1/498
[52] U.S. Cl. ................. 430/619; 430/617; 430/353; 430/440; 430/483
[58] Field of Search ................. 430/617, 619, 430/353, 440, 483

[56] References Cited

U.S. PATENT DOCUMENTS

| | | | |
|---|---|---|---|
| 2,681,294 | 6/1954 | Beguin | 430/523 |
| 3,635,719 | 1/1972 | Ohkubo et al. | 430/617 |
| 4,123,274 | 10/1978 | Knight et al. | 430/619 |
| 4,220,709 | 9/1980 | deMauriac | 430/353 |
| 5,001,032 | 3/1991 | Katayama et al. | 430/619 |
| 5,370,987 | 12/1994 | Kobayashi et al. | 430/619 |

FOREIGN PATENT DOCUMENTS

| | | |
|---|---|---|
| 43-4921 | 2/1968 | Japan . |
| 43-4924 | 2/1968 | Japan . |
| 44-30270 | 12/1969 | Japan . |
| 45-18416 | 6/1970 | Japan . |
| 55-50246 | 4/1980 | Japan . |
| 58-115638 | 7/1983 | Japan . |
| 58-118639 | 7/1983 | Japan . |
| 59-55429 | 3/1984 | Japan . |

*Primary Examiner*—Mark F. Huff
*Attorney, Agent, or Firm*—Fitzpatrick, Cella, Harper & Scinto

[57] ABSTRACT

A dry process silver salt photosensitive material is disclosed which has a support and a photosensitive layer. The photosensitive layer contains at least a photosensitive silver halide or photosensitive silver halide forming component, an organic silver salt and a pyrrole compound. The photosensitive material has a broad latitude for heat development and can form images with a high contrast.

8 Claims, No Drawings

DRY PROCESS SILVER SALT PHOTOSENSITIVE MATERIAL AND IMAGE FORMING METHOD MAKING USE OF THE DRY PROCESS SILVER SALT PHOTOSENSITIVE MATERIAL

BACKGROUND OF THE INVENTION

1. Field of the Invention

The present invention relates to a dry process silver salt photosensitive material on which development is carried out by a dry process. It also relates to an image forming method making use of this dry process silver salt photosensitive material.

2. Related Background Art

Silver salt photography making use of silver halides is a recording technique that can achieve excellent photosensitivity and gradation and has been widely used. This photography, however, after imagewise exposure, makes use of a wet process in the processing steps such as developing, fixing and washing, and hence has inferior operability, simplicity and safety, which have hitherto come into question.

As countermeasures therefor, dry-process photographic materials that do not require such wet processing are disclosed in Japanese Patent Publications No. 43-4921, No. 43-4924, etc. These make use of a photosensitive silver halide approximately in an amount required as a catalyst and also a non-photosensitive organic silver salt as an image forming agent. The mechanism by which the organic silver salt acts as an image forming agent is presumed as follows: (1) A silver nucleus is produced from a photosensitive silver halide as a result of imagewise exposure, and it forms a latent image. (2) The silver nucleus serves as a catalyst, an organic silver salt and a reducing agent cause oxidation-reduction reaction upon heating, and the organic silver salt is reduced to metallic silver, which forms a visible image.

As an example of methods of utilizing such a dry process silver salt photosensitive material, Japanese Patent Application Laid-open No. 55-50246 discloses a method of use as a mask. In this method, a silver image is used as a mask. Such conventional dry process silver salt photosensitive materials, however, have been disadvantageous in that they have a narrow latitude for developing temperatures, and silver images formed are reddish, can not be pure-black and also have a low optical density.

The dry process silver salt photosensitive materials are advantageous over wet process silver salt photosensitive materials in view of the fact that no wet processing is required. Accordingly, it has been hitherto sought to make the contrast of the former materials comparable to, or more improved than, that of the latter wet process silver salt photosensitive materials. However, conventional dry process silver salt photosensitive materials have had the problem that they have a narrow latitude for heat development and variations in development performance are caused by delicate differences of heating temperatures.

SUMMARY OF THE INVENTION

The present invention was made taking account of the problems discussed above. An object thereof is to provide a dry process silver salt photosensitive material that has a broad latitude for heat development and can form images with a high contrast, and an image forming method making use of such a dry process silver salt photosensitive material.

The dry process silver salt photosensitive material of the present invention comprises a support and provided thereon a photosensitive layer containing at least a photosensitive silver halide or photosensitive silver halide forming component, an organic silver salt and a pyrrole compound.

The image forming method of the present invention comprises subjecting the above dry process silver salt photosensitive material to imagewise exposure and heating to form an image.

DESCRIPTION OF THE PREFERRED EMBODIMENTS

The dry process silver salt photosensitive material of the present invention comprises a support and a photosensitive layer provided thereon. The photosensitive layer contains a photosensitive silver halide or photosensitive silver halide forming component, an organic silver salt and a pyrrole compound, and also optionally contains a polymerizable polymer precursor and a photopolymerization initiator. The pyrrole compound is used as a reducing agent. Use of the pyrrole compound makes the heat development latitude broader and also makes it possible to stably obtain images with a good contrast.

The pyrrole compound used in the present invention may particularly preferably be a compound represented by the following formula (I).

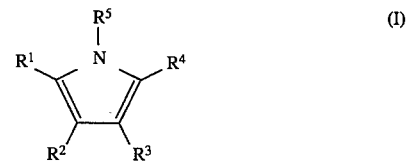

wherein $R^1$, $R^2$, $R^3$ and $R^4$ each represent a substituted or unsubstituted aryl group, a substituted or unsubstituted alkyl group, an aralkyl group, an acyl group, an ester group, a nitro group, a nitrile group or a hydrogen atom; and $R^5$ represents a substituted or unsubstituted aryl group, a substituted or unsubstituted alkyl group, an aralkyl group, an acyl group, an ester group or a hydrogen atom. $R^1$, $R^2$, $R^3$, $R^4$ and $R^5$ may be the same or different one another.

The substituted or unsubstituted aryl group represented by $R^1$ to $R^5$ may preferably be, for example, phenyl, naphthyl, tolyl or xylyl. The substituent any of these may have may preferably be, for example, a hydroxyl group, a halogen atom, an ester group or an alkylacyl group having 1 to 18 carbon atoms.

The substituted or unsubstituted alkyl group represented by $R^1$ to $R^5$ may be either linear or cyclic.

The substituted alkyl group may preferably be those having 1 to 18 carbon atoms, and more preferably an alkoxyalkyl group having 2 to 18 carbon atoms, a halogenoalkyl group having 1 to 8 carbon atoms, a hydroxyalkyl group having 1 to 8 carbon atoms, or an aminoalkyl group having 1 to 18 carbon atoms.

The alkoxyalkyl group may preferably be, for example, methoxyethyl, ethoxymethyl, ethoxyethyl, ethoxypropyl, ethoxybutyl, propoxymethyl, propoxybutyl, i-propoxypentyl, t-butoxyethyl or hexyloxybutyl.

The halogenoalkyl group may preferably be, for example, chloromethyl, chloroethyl, bromoethyl, chloropropyl, chlorobutyl, chlorohexyl or chloroctyl.

The hydroxyalkyl group may preferably be, for example, hydroxymethyl, hydroxyethyl, hydroxypropyl, hydroxybutyl, hydroxypentyl, hydroxyhexyl or hydroxyheptyl.

The aminoalkyl group may preferably be, for example, aminomethyl, acetylaminomethyl, dimethylaminomethyl, aminoethyl, acetylaminoethyl, dimethylaminoethyl, diethylaminoethyl, morpholinoethyl, piperidinoethyl, diethylaminopropyl, dipropylaminoethyl, acetylaminopropyl, aminobutyl or morpholinobutyl.

The unsubstituted alkyl group may preferably be, for example, methyl, ethyl, propyl, butyl, i-butyl, t-butyl, amyl, i-amyl, sec-amyl, hexyl, t-octyl, texyl, heptyl, octyl, nonyl, dodecyl, stearyl, behenyl, cyclopentl, cyclohexyl, cycloheptyl, methylcyclohexyl or dimethylcyclohexyl.

The aralkyl group represented by $R^1$ to $R^5$ may preferably be, for example, benzyl, phenethyl, tolylmethyl, hydroxybenzyl, 2-hydroxy-3-methylbenzyl or 2-hydroxy-3-t-butylbenzyl.

The acyl group represented by $R^1$ to $R^5$ may preferably be those having 1 to 18 carbon atoms, as exemplified by formyl, acetyl, propionyl, lauroyl or stearoyl.

The ester group represented by $R^1$ to $R^5$ may preferably be those having 1 to 18 carbon atoms, as exemplified by formate, acetate, butyrate or laurate.

At least one of $R^1$, $R^2$, $R^3$ and $R^4$ may preferably be a hydroxyaryl group. The hydroxyaryl group may preferably be, for example, 2-hydroxyphenyl, 4-hydroxyphenyl, 1-hydroxynaphthyl, 2-hydroxynaphthyl or 4-hydroxynaphthyl.

Preferred examples of the reducing agent represented by Formula (I) are shown below.

2-(2-Hydroxyphenyl)pyrrole, 2-(2-hydroxyphenyl)-5-phenylpyrrole, 2-(2-hydroxy-4-methoxyphenyl)pyrrole, 2-(2-hydroxy-4-diethylaminophenyl)pyrrole, 2-(3,5-di-t-butyl-4-hydroxyphenyl)pyrrole, 2-(3,5-di-t-butyl-4-hydroxyphenyl)-5-phenylpyrrole, 2-(4-hydroxyphenyl)pyrrole, 2-(4-hydroxyphenyl)-5-phenylpyrrole, 2-(2-hydroxyphenyl)-3,4-diphenylpyrrole, 2-(2-hydroxyphenyl)-3,5-diphenylpyrrole, 2-phenylpyrrole, 2,3-diphenylpyrrole, 2,5-diphenylpyrrole, 2,3,5-triphenylpyrrole, 2-(2-hydroxyphenyl)-3-hydroxyphenyl)-3-phenylpyrrole, 2-(2-hydroxyphenyl)-5-(4-methylphenyl)pyrrole, 2-(2-hydroxy-3-ethylphenyl)pyrrole, 2-(2-hydroxy-3-ethylphenyl)-5-phenylpyrrole, 2-(2-hydroxy-3-t-butylphenyl)-5-phenylpyrrole, 2,5-di(2-hydroxyphenyl)pyrrole, 2,3-di(2-hydroxyphenyl)pyrrole, 2-(2-hydroxyphenyl)-3-methoxycarbonylpyrrole, 2-(2-hydroxyphenyl)-3-methoxycarbonyl-5-phenylpyrrole, 2-(2-hydroxyphenyl)-3,4-dibenzoylpyrrole, 2-methyl-3-phenyl-5-(2-hydroxyphenyl)pyrrole, 2-methyl-3-phenyl-5-(4-hydroxyphenyl)pyrrole, 2-isopropyl-3-phenyl-5-(4-hydroxyphenyl)pyrrole, 2-n-hexyl-3-phenyl-5-(2-hydroxyphenyl)pyrrole, 2-benzyl-5-(2-hydroxyphenyl)pyrrole, 2-benzyl-3-phenyl-5-(2-hydroxyphenyl)pyrrole, 2-(1-hydroxy-2-naphthyl)-5-phenylpyrrole, 2-(1-hydroxy-2-naphthyl)-5-methylpyrrole, 2-(1-hydroxy-2-naphthyl)-5-naphthylpyrrole, 2-(1-hydroxy-2-naphthyl)-5-(2-naphthyl)pyrrole, 2-(1-hydroxy-2-naphthyl)-3,4-dimethoxycarbonylpyrrole, 2-(1-hydroxynaphthyl)-4,5-diphenylpyrrole, and 2-(2-hydroxyphenyl)-5-methylpyrrole.

In particular, the reducing agent represented by Formula (I) may preferably be 2-(2-hydroxyphenyl)-5-phenylpyrrole, 2-(2-hydroxyphenyl)-3-methoxycarbonyl-5-phenylpyrrole, 2-(2-hydroxyphenyl)-5-methylpyrrole, 2-(4-hydroxyphenyl)-5-phenylpyrrole or 2-(4-hydroxyphenyl)pyrrole, The reducing agent of Formula (I) may be used alone or may be used in combination of two or more kinds.

In addition to the reducing agent of Formula (I), the dry process silver salt photosensitive material of the present invention may contain any conventionally known reducing agents selected from the following groups (A) to (G).

(A) o-Bisphenols such as 2,2'-methylenebis(4-methyl-6-t-butylphenol), 2,2'-methylenebis(4-ethyl-6-t-butylphenol), 2,2'-methylenebis(4,6-di-t-butylphenol), 2,2'-methylenebis(4,6-dimethylphenol), 2,2'-(3,5,5-trimethylbenzylidene)-bis(4,6-dimethylphenol), and 2,2'-(3,5,5-trimethylbenzylidene)-bis(4,6-di-t-butylphenol).

(B) p-Bisphenols such as 4,4'-methylenebis(2,6-di-t-butylphenol), 4,4'-methylenebis(2-methyl-6-t-butylphenol), 4,4'-butylidenebis(2,6-di-t-butylphenol), 2,6-di-t-butyl-4-(3,5-dimethyl-4-hydroxybenzyl)phenol, 2,6-di-t-butyl-4-(3,5-diethyl-4-hydroxybenzyl)phenol, 2,6-di-t-butyl-4-(3,5-dimethoxy-4-hydroxybenzyl)phenol, 4,4'-benzylidenebis(2-methyl-6-t-butylphenol), and 4,4'-benzylidenebis(2-methyl-6-cylclohexylphenol).

(C) Phenols such as hydroquinone monomethyl ether, 2,6-dichloro-4-aminophenol, p-aminophenol, propyl gallate, hydroquinone, and 2,6-dichloro-4-benzenesulfonamidophenol.

(D) Binaphthols such as 1,1'-bi-naphthol and 1,1'-bi-4-methyl-2-naphthol.

(E) Bisnaphthols such as 4,4'-methylenebis(2-methyl-1-naphthol), 4,4'-methylenebis(2-ethyl-1-naphthol), and 4,4'-ethylidenebis(2-methyl-1-naphthol).

(F) Naphthols such as 1-naphthol, 4-chloro-1-naphthol, 4-methyl-1-naphthol, 4-methoxyl-1-naphthol, 2-ethyl-4-p-hydroxybenzylnaphthol, and 2-ethyl-4-p-tolylmethylnaphthol.

(G) Naphthylmethylphenols such as 2,6-dimethyl-4-(4-hydroxy-3-methylnaphthylmethyl)phenol, 2,6-diethyl-4-(4-hydroxy-3-methylnaphthylmethyl)phenol, 2,6-di-t-butyl-4-(4-hydroxy-3-methylnaphthylmethyl)phenol, 2,6-diethyl-4-(4-hydroxynaphthylmethyl)phenol, and 2-methyl-6-t-butyl-4-(4-hydroxy-3-methylnaphthylmethyl)phenol.

As the organic silver salt used in the present invention, it is possible to use organic acid silver salts and triazole silver salts as disclosed in SHASHIN KOGAKU NO KISO (Basic Photographic Engineering), First Edition, Korona-sha Co., Japan Photographic Society, 1982, The Volume of Non-silver salts, p.247, or Japanese Patent Application Laid-open No. 59-55429. It is preferred to use silver salts with a low photosensitivity. They may include, for example, silver salts of aliphatic carboxylic acids, aromatic carboxylic acids; mercapto group or α-hydrogen-containing thiocarbonyl group compounds, and imino group-containing compounds.

The aliphatic carboxylic acids may include acetic acid, butyric acid, succinic acid, sebacic acid, adipic acid, oleic acid, linolic acid, lenolenic acid, tartaric acid, palmitic acid, stearic acid, behenic acid and camphor acid. In general, silver salts having a smaller number of carbon atoms are proportionally not stabler, and hence those having an appropriate number of carbon atoms (e.g., those having 16 to 26 carbon atoms) are preferred.

The aromatic carboxylic acids may include benzoic acid derivatives, quinolinic acid derivatives, naphthalene carboxylic acid derivatives, salicylic acid derivatives, gallic acid, tannic acid, phthalic acid, phenyl acetic acid derivatives, and pyromellitic acid.

The compounds having a mercapto or thiocarbonyl group may include 3-mercapto-4-phenyl-1,2,4-triazole, 2-mercaptobenzoimidazole, 2-mercapto-5-aminothiadiazole, 2-mercaptobenzothiazole, S-alkylthioglycolic acid (alkyl group carbon atom number of 12 to 22), dithiocarboxylic acids such as dithioacetic acid, thioamides such as thiostearoamide; 5-carboxy-1-methyl-2-phenyl-4-thiopyridine, mercaptotriazine, 2-mercaptobenzoxazole, mercaptooxadiazole, 3-amino-5-benzylthio-1,2,4-triazole, and mercapto compounds disclosed in U.S. Pat. No. 4,123,274.

The compounds having an imino group may typically include benzotriazole or derivatives thereof, described in Japanese Patent Publication No. 44-30270 or No. 45-18416, as exemplified by benzotriazole, alkyl-substituted benzotriazoles such as methylbenzotriazole, halogen-substituted benzotriazoles such as 5-chlorobenzotriazole, carboimidobenzotriazoles such as butylcarboimidobenzotriazole, nitrobenzotriazoles as disclosed in Japanese Patent Application Laid-open No. 58-118639, sulfobenzotriazole, carboxybenzotriazole or salts thereof, or hydroxybenzotriazole, disclosed in Japanese Patent Application Laid-open No. 58-115638, 1,2,4-triazole, disclosed in U.S. Pat. No. 4,220, 709, or 1H-tetrazole, carbazole, saccharin, imidazole and derivatives thereof.

The photosensitive silver halide may include, for example, silver chloride, silver bromide, silver chlorobromide, silver iodobromide and silver chloroiodobromide. These may have been subjected to chemical sensitization or spectral sensitization carried out on conventional photographic emulsions. More specifically, as the chemical sensitization, sulfur sensitization, noble metal sensitization or reduction sensitization can be used. As the spectral sensitization, a method making use of hitherto well known spectral sensitizers can be applied.

The spectral sensitizer may include cyanine dyes, merocyanine dyes and trinuclear dyes. Those which can be preferably used are exemplified by 3,3'-dicarboxyethyl-2,2'-thiacarbocyanine iodide, 3,3'-diethyl-2,2'-thiacarbocyanine iodide, 3,3'-disulfoethyl-2,2'-thiadicarbocyanine bromide and 3,3'-diethyl-2,2'-thiatricarbocyanine iodide.

The silver halide may have a uniform halogen composition in a grain, or a multiple structure having a different halogen composition in a grain. Two or more kinds of silver halides having different halogen composition, grain size, grain size distribution, etc. may be used in combination.

The photosensitive silver halide forming component may include, for example, ammonium bromide, lithium bromide, sodium chloride and N-bromosuccimide.

A binder may also be appropriately contained in the photosensitive material of the present invention for the purpose of improving film forming properties of the photosensitive layer.

The binder may include cellulose esters as exemplified by nitrocellulose, cellulose phosphate, cellulose sulfate, cellulose acetate, cellulose propionate, cellulose butyrate, cellulose myrystate, cellulose palmirate, cellulose acetate propionate, and cellulose acetate butyrate; cellulose ethers as exemplified by methyl cellulose, ethyl cellulose, propyl cellulose, and butyl cellulose; vinyl resins as exemplified by polystyrene, polyvinyl chloride, polyvinyl acetate, polyvinyl butyral, polyvinyl acetal, polyvinyl alcohol, and polyvinyl pyrrolidone; copolymer resins as exemplified by a styrene/butadiene copolymer, a styrene/acrylonitrile copolymer, a styrene/butadiene/acrylonitrile copolymer, and a vinyl chloride/vinyl acetate copolymer; acrylic resins as exemplified by polymethyl methacrylate, polymethyl acrylate, polybutyl acrylate, polyacrylic acid, polymethacrylic acid, polyacrylamide, and polyacrylonitrile; polyesters as exemplified by polyethylene terephthalate; polyacrylate resins as exemplified by poly(4,4'-isopropylidene-diphenylene-co-1,4-cyclohexylenedimethylene carbonate), poly(ethylenedioxy-3,3'-phenylene thiocarbonate), poly(4,4'-isopropylidene, diphenylene carbonate-co-terephthalate), poly(4,4'-isopropylidene-diphenylene carbonate), poly(4,4'-sec-butylidene-diphenylene carbonate), and poly(4,4'-isopropylidene-diphenylene carbonate-block-oxyethylene); polyamides; polyimides; epoxy resins; phenol resins; polyolefins as exemplified by polyethylene, polypropylene, and chlorinated polyethylene; and natural polymers such as gelatin.

The above components in the photosensitive layer in the present invention may preferably be mixed in the following proportions.

The organic silver salt used may preferably be in an amount of from 0.3 $g/m^2$ to 30 $g/m^2$, particularly preferably 0.7 $g/m^2$ to 15 $g/m^2$, and more preferably 1.2 $g/m^2$ to 8 $g/m^2$.

The photosensitive silver halide should preferably be contained in an amount of from 0.001 mol to 2 mols, and more preferably from, 0.05 mol to 1 mol, per mol of the organic silver salt. In the present invention, the silver halide forming component may be used in place of the silver halide. In such an instance, the silver halide forming component may be considered to be in the same content as the silver halide. The reducing agent represented by Formula (I) should preferably be contained in an amount of from 0.05 mol to 3 mols, and mope preferably from 0.2 mol to 1.5 mols, per mol of the organic silver salt. In the case when any reducing agent other than that represented by Formula (I) is used, the reducing agent other than that represented by Formula (I) may preferably be used in an amount of from 0.01 mol to 3 mols, and mope preferably from 0.05 mol to 1.5 mols, per mol of the organic silver salt.

In the case when the binder is contained in the photosensitive layer, the proportion of the binder to the organic silver salt may preferably be in the range of from 10:1 to 1:10, and mope preferably in the range of from 4:1 to 1:2.

The photosensitive material of the present invention may optionally contain a tone modifier as an additive.

The tone modifier is used when the metallic silver produced as a result of reduction should be blackened. Effective tone modifiers depend on the types of the organic silver salt and reducing agent used. Most commonly available tone modifiers can be exemplified by phthalazinones, oxazindiones, cyclic imides, urazoles, 2-pyrazolin-5-ones, quinazolines, N-hydroxynaphthalimides, uracils, phthalazinediones and thiazolidinediones.

In the case when the tone modifier is used, it may be used in an amount ranging from about 0.0001 mol to about 2 mols, and preferably from about 0.0005 mol to about 1.5 mol, per mol of the organic silver salt.

In addition, an antifoggant, an alkali agent, a surface active agent, etc. may also be added to the photosensitive layer in the present invention.

The dry process silver salt photosensitive material of the present invention may be provided with an antistatic layer or a conductive layer. It may also be incorporated with an anti-halation dye.

The dry process silver salt photosensitive material used in working the present invention may further optionally be incorporated with a matting agent as exemplified by starch, titanium dioxide, zinc oxide or silica. It may also be incorporated with an optical brightening agent, including, for example, stilbenes, tirazines, oxazoles, and cumarin optical brightening agents.

In order to improve transparency, increase image density and improve raw stock stability of the dry process silver salt photosensitive material, and in some instances in order to improve heat resistance of the photosensitive material, the photosensitive layer may optionally be provided thereon with a protective layer. The protective layer may suitably have a layer thickness of from 1 micron to 20 microns. A layer with a thickness excessively smaller than this may have no effect stated above, and a layer with an excessively large thickness can give no particular effect, only resulting in a high cost. Polymers used in the protective layer may preferably be those being heat-resistant, colorless and soluble in solvents, as exemplified by polyvinyl chloride, polyvinyl acetate, copolymers of vinyl chloride and vinyl acetate (preferably containing 50 mol % or more of vinyl chloride), polyvinyl butyral, polystyrene, polymethyl methacrylate, benzyl cellulose, ethyl cellulose, cellulose acetate-butyrate, cellulose diacetate, cellulose triacetate, polyvinylidene chloride, chlorinated polypropylene, polyvinylpyrrolidone, cellulose propionate, polyvinyl formal, cellulose acetate butyrate, polycarbonate, and cellulose acetate propionate. They may also include gelatin, gelatin derivatives such as phthalated gelatin, acrylamide polymers, polyisobutylene, a butadiene-styrene copolymer (with any desired monomer ratio), and polyvinyl alcohol.

Polymers preferable for the protective layer are those having a heat resistance of 115° C. or above and a refractive index of 1.45 or more at 20° C.

As the support used in the present invention, extensively various kinds of supports can be used. Typical supports can be exemplified by cellulose nitrate films, cellulose ester films, polyvinylacetal films, polystyrene films, polyethylene terephthalate films, polycarbonate films, baryta paper, and glass sheets, paper, metal sheets or the like. As the paper, it is suitable to use paper having been subjected to hydrophilic treatment. It is also suitable to use paper having been sized using a polysaccharide or the like.

The dry process silver salt photosensitive material of the present invention may have the photosensitive layer, conductive layer, protective layer and so forth having been respectively individually formed. In such cases, each of these layers can be provided by various coating processes. Coating processes that form the respective layers can be exemplified by dipping, air-knife coating, curtain coating, and extrusion coating making use of a hopper as disclosed in U.S. Pat. No. 2,681,294. If necessary, two or more layers can be simultaneously coated.

The dry process silver salt photosensitive material is subjected to imagewise exposure and heating (heat development), and a pattern corresponding with the difference in light-absorption can be formed utilizing light-absorbing properties of the image thus formed. More specifically, light is absorbed at the imagewise exposed area and light is less absorbed at the imagewise unexposed area, where there are differences in light-absorbing properties, and a pattern corresponding therewith can be formed.

Utilizing the above difference in light-absorbing properties, it is also possible for the dry process silver salt photosensitive material of the present invention to form a pattern comprised of a polymerized area and an unpolymerized area (hereinafter "polymerized-unpolymerized pattern"). That is, the photosensitive layer according to the present invention may be incorporated with a polymerizable polymer precursor and a photopolymerization initiator, followed by exposure, heating (heat development) and polymerization exposure, so that the polymerized-unpolymerized pattern can be formed. The mechanism by which the polymerized-unpolymerized pattern is formed is that no polymerization proceeds in the imagewise exposed area because of the light absorption attributable to the silver, and the polymerization proceeds in the imagewise unexposed area.

The polymerizable polymer precursor and the photopolymerization initiator may be contained in the photosensitive layer. Alternatively, a polymerizing layer containing the polymerizable polymer precursor and photopolymerization initiator may be provided separately from the photosensitive layer.

The photosensitive layer and the polymerizing layer may be formed in laminae in the order of the polymerizing layer and the photosensitive layer from the support side, or in the order of the photosensitive layer and the polymerizing layer from the support side. Alternatively, they may hold a support between them, one side of which the photosensitive layer is provided and the other side of which the polymerizing layer is provided.

The photopolymerization initiator used in this case includes those capable of being activated by light and not capable of being activated by heat, as exemplified by carbonyl compounds, sulfur compounds, halogen compounds, photopolymerization initiators of a redox type, and initiators of a peroxide type capable of being sensitized with a dye such as pyrylium.

Stated specifically, the carbonyl compounds may include diketones as exemplified by benzyl, 4,4'-dimethoxybenzyl, diacetyl, and camphorquinone; benzophenones as exemplified by 4,4'-bis(diethylamino)benzophenone, and 4,4'-dimethoxybenzophenone; acetophenones as exemplified by acetophenone, and 4-methoxyacetophenone; benzoin alkyl ethers; thioxanthones as exemplified by 2-chlorothioxanthone, 2,4-dichlorothioxanthone, 2,4-diethylthioxanthone, and thioxanthone-3-carboxylic acid-$\beta$-methoxy ethyl ester; chalcones and styrylketones having a dialkylamino group; and coumarins as exemplified by 3,3'-carbonylbis(7-methoxycoumarin), and 3,3'-carbonylbis(7-diethylcoumarin).

The sulfur compounds include, for example, dibenzothiazolyl sulfide, decylphenyl sulfide, and disulfides.

The halogen compounds include, for example, carbon tetrabromide, quinolinesulfonyl chloride, and S-triazines having a trihalomethyl group.

The photopolymerization initiators of radox type include those used in combination of a trivalent iron ionic compound (as exemplified by ferric ammonium citrate) with a peroxide, and those used in combination of a photoreducing coloring matter such as riboflavin or Methylene Blue with a reducing agent such as triethanolamine or ascorbic acid.

In the photopolymerization initiator described above (including the sensitizer), two or more photopolymerization initiators can also be used in combination to effect a more efficient photopolymerization reaction.

Such combination of the photopolymerization initiators includes a combination of chalcones having a dialkylamino group and styrylketones or coumarins, with S-triazines having a trihalomethyl group or camphorquinone.

As the polymerizable polymer precursor used in the photosensitive material of the present invention, a compound having at least one reactive vinyl group in its molecule can be utilized.

The reactive vinyl group in these compounds may include substituted or unsubstituted vinyl groups having polymerization reactivity, as exemplified by styrene vinyl groups, acrylic acid vinyl groups, methacrylic acid vinyl groups, allyl vinyl groups, and vinyl ethers, as well as ester vinyl groups such as vinyl acetate.

Preferred polymerizable polymer precursors satisfying such conditions are shown below.

They may include monovalent monomers as exemplified by styfane, methylstyrene, chlorostyrene, bromostyrene, methoxystyrene, acrylic acid, methyl acrylate, ethyl acrylate, cyclohexyl acrylate, acrylamide, methacrylic acid, methyl methacrylate, ethyl methacrylate, propyl methacrylate, butyl methacrylate, phenyl methacrylate, cyclohexyl methacrylate, vinyl pyridine, N-vinylpyrrolidone, N-vinylimidazole and 2-vinylimidazole; divalent monomers as exemplified by divinylbenzene, distyryl oxalate, distyryl malonate, distyryl succinate, distyryl glutarate, distyryl adipate, distyryl maleate, distyPyl fumarate, distyryl $\beta,\beta'$-dimethylglutarate, distyryl 2-bromoglutarate, distyryl $\alpha,\alpha'$-dichloroglutarate, distyryl terephthalate, oxalic acid di(ethyl acrylate), oxalic acid di(methyl acrylate), malonic acid di(ethyl acrylate), malonic acid di(methyl ethyl acrylate), succinic acid di(ethyl acrylate), glutaric acid di(ethyl acrylate), adipic acid di(ethyl acrylate), maleic acid di(ethyl acrylate), fumaric acid di(ethyl acrylate), $\beta,\beta$-dimethylglutaric acid di(ethyl acrylate), ethylenediacrylamide, propylenediacrylamide, 1,4-phenylenediacrylamide, 1,4-phenylenebis(oxyethyl acrylate), 1,4-phenylenebis(oxymethyl ethyl acrylate), 1,4-bis(acryloyloxyethoxy)cyclohexane, 1,4-bis(acryloyloxymethylethoxy)cyclohexane, 1,4-bis(acryloyloxyethoxycarbamoyl)benzene, 1,4-bis(acryloyloxymethylethoxycarbamoyl)benzene and 1,4-bis(acryloyloxyethoxycarbamoyl)cyclohexane; trivalent monomers as exemplified by pentaerythritol triacrylate, pentaerythritol trimethacrylate, pentaerythritol tri(hydroxystyrene), dipentaerythritol hexaacrylate, cyanuric acid triacrylate, cyanuric acid trimethacrylate, 1,1,1-trimethylolpropane triacrylate, 1,1,1-trimethylolpropane trimethacrylate, cyanuric acid tri(ethyl acrylate), 1,1,1-trimethylolpropane tri(ethyl acrylate) and cyanuric acid tri(ethyl vinyl ether); tetravalent monomers as exemplified by ethylenetetraacrylamide and propylenetetraacrylamide; and hexavalent monomers such as dipentaerythritol hexaacrylate.

The above polymerizable polymer precursors may be used in combination of two or more kinds.

In the instance where the polymerizable polymer precursor and the photopolymerization initiator are contained in the dry process silver salt photosensitive material of the present invention, the photopolymerization initiator may preferably be contained in an amount of from 0.01 mol to 10 mols, and more preferably from 0.5 mol to 3.0 mols, per mole of the reducing agent. The photopolymerization initiator should preferably be in an amount of from 0.1 part by weight to 30 parts by weight, and more preferably from 0.5 part by weight to 10 parts by weight, based on 100 parts by weight of the polymerizable polymer precursor.

In the present invention, the photosensitive layer may preferably have a thickness of from 0.1 μm to 50 μm, more preferably from 1 μm to 30 μm, and particularly preferably from 2 μm to 20 μm.

In the case when the polymerizing layer is provided separately from the photosensitive layer, the polymerizing layer may have the thickness in the same range as the range of the thickness of the photosensitive layer.

As light sources used in the steps of imagewise exposure and polymerization exposure, usable are, for example, sunlight, tungsten lamps, mercury lamps, halogen lamps, xenon lamps, fluorescent lamps, LEDs, and lasers, and the wavelength of the light used in these steps may be the same or different. Even if the light having the same wavelength is used, the latent image can be sufficiently written with use of light having an intensity of the level that does not cause photopolymerization in the step of imagewise exposure, since the photosensitive silver halide usually has a sufficiently higher photosensitivity than the photopolymerization initiator. For example, in the step of imagewise exposure, the exposure may be carried out using light that may give about 1 mJ/cm$^2$ or less at the surface of the photosensitive material. In the step of polymerization exposure, the exposure may be carried out using light that may give about 500 mJ/cm$^2$ or less at the surface of the photosensitive material.

Various kinds of means are available as a means of heat-developing the photosensitive material of the present invention. For example, the photosensitive material may be brought into contact with a simple heating plate. Alternatively, it may be brought into contact with a heated drum. In some instances, it may also be passed through a heated space. It may also be heated by high-frequency heating or using laser beams. It is suitable to carry out the heating at a temperature of from 80° C. to 160° C., preferably from 100° C. to 160° C., and more preferably from 110° C. to 150° C. The heating time may be elongated or shortened, whereby a higher temperature or lower temperature within the above range can be used. Developing time may be usually from about 1 second to about 60 seconds, and preferably form 3 seconds to 20 seconds.

EXAMPLES

The present invention will be described below in greater detail by giving Examples. In the following, "part(s)" indicates "part(s) by weight".

Example 1

A photosensitive material dispersion with the following composition was prepared using a homomixer under safelight.

| | |
|---|---|
| Polyvinyl butyral | 3.0 parts |
| Silver behenate | 2.5 parts |
| Silver bromide | 1.0 part |
| Phthalazinone | 0.3 part |
| Homophthalic acid | 0.3 part |
| 2-(2-hydroxyphenyl)-5-phenylpyrrole | 0.8 part |
| Xylene | 30 parts |
| n-Butanol | 30 parts |

The above photosensitive material dispersion was coated on a 6 μm thick polyethylene terephthalate film (PET film) in a dried-coating thickness of 10 to 12 μm to form a photosensitive layer. On this photosensitive layer, a polyvinyl alcohol layer (PVA layer) was further provided in a dried-coating thickness of 2 μm. Thus, dry process silver salt photosensitive material A of the present invention was produced.

On the photosensitive layer of the dry process silver salt photosensitive material A thus produced, a mask film having light-transmitting areas and light-screening areas was superposed, which was then exposed to 1,000 lux light (light source: a tungsten lamp) for 10 seconds. Thereafter, the dry process silver salt photosensitive material A was heated through a heat-developing machine adjusted to 115° C. Heating time was 10 seconds. As a result, the imagewise exposed areas of the dry process silver salt photosensitive material A were thermally developed and images were formed.

On the dry process silver salt photosensitive material A on which the images were thus formed, maximum optical density (O.D.max) of imagewise exposed areas and fog density (O.D.min) of imagewise unexposed areas were measured. They were measured using a transmission-reflection dual purpose color densitometer NLM-STD-Tr, available from Narumi Shokai Co. Developing temperature latitude was also measured. In the present invention, the developing temperature latitude was measured in the following way: Images were formed on a plurality of dry process silver salt photosensitive materials at respectively different heat development temperatures, and the range of heat development temperatures where the maximum optical density (O.D.max) of imagewise exposed areas comes to be 2.0 or more and the fog density (O.D.min) of imagewise unexposed areas 0.2 or less were regarded as the developing temperature latitude. The results of measurement are shown in Table 1.

Example 2

Dry process silver salt photosensitive material B of the present invention was produced in the same manner as in Example 1 except that in the dispersion prepared therein the reducing agent 2-(2-hydroxyphenyl)-5-phenylpyrrole was replaced with 1.9 parts of 2-(2-hydroxyphenyl)-3-methoxycarbonyl-5-phenylpyrrole. On the photosensitive material B, images were formed and measurement was made in the same manner as in Example 1. The results of measurement are shown in Table 1.

Examples 3, 4 & 5

Dry process silver salt photosensitive materials C, D and E of the present invention were produced in the same manner as in Example 1 except that in the dispersion prepared therein the reducing agent 2-(2-hydroxyphenyl)-5-phenylpyrrole was replaced with the reducing agents as shown in Table 1. On these photosensitive materials C, D and E, images were formed and measurement was made in the same manner as in Example 1. The results of measurement are shown in Table 1.

TABLE 1

| Example: | Photo-sensitive material | Reducing agent | Amount (part) | O.D. max/ O.D. min | Dev. temp. latitude (°C.) |
|---|---|---|---|---|---|
| 1 | A | 2-(2-Hydroxyphenyl)-5-phenylpyrrole | 0.8 | 3.52/0.20 | 5.0 |
| 2 | B | 2-(2-Hydroxyphenyl)-3-methoxycarbonyl-5-phenylpyrrole | 1.9 | 3.37/0.18 | 4.0 |
| 3 | C | 2-(2-Hydroxyphenyl)-5-methylpyrrole | 1.1 | 3.56/0.21 | 4.0 |
| 4 | D | 2-(4-Hydroxyphenyl)-5-phenylpyrrole | 1.5 | 3.21/0.19 | 4.5 |
| 5 | E | 2-(4-Hydroxyphenyl)-pyrrole | 1.0 | 3.50/0.21 | 3.5 |

Comparative Examples 1 to 3

Dry process silver salt photosensitive materials G, H and I of the present invention were produced in the same manner as in Example 1 except that the reducing agent was replaced with compounds other than the pyrrole compound as shown in Table 2. On these photosensitive materials G, H and I, images were formed and measurement was made in the same manner as in Example 1. The results of measurement are shown in Table 2.

TABLE 2

| Comparative Example: | Photo-sensitive material | Reducing agent | Amount (part) | O.D. max/ O.D. min | Dev. temp. latitude (°C.) |
|---|---|---|---|---|---|
| 1 | G | 2,2'-Hydroxy-3,3'-d-t-butyl-5,5'-dimethylbiphenyl | 1.1 | 1.82/0.20 | 1.0 |
| 2 | H | 2,2'-Hydroxy-3,3'-d-t-butyl-5,5'-dimethoxybiphenyl | 1.5 | 1.78/0.22 | 0.5 |
| 3 | I | 2,2'-Dihydroxy-3,3'-dibenzyl-5,5'- | 1.1 | 1.80/0.24 | 1.0 |

TABLE 2-continued

| Comparative Example: | Photosensitive material | Reducing agent | Amount (part) | O.D. max/ O.D. min | Dev. temp. latitude (°C.) |
|---|---|---|---|---|---|
| | | dipropylbiphenyl | | | |

In the present invention, the incorporation of the pyrrole compound as a reducing agent in the photosensitive layer has brought about a broader developing temperature latitude of the photosensitive material, and also has made it possible to obtain images with a high contrast.

What is claimed is:

1. A dry process silver salt photosensitive material comprising: a support and provided thereon a photosensitive layer containing at least a photosensitive silver halide or photosensitive silver halide forming component, an organic silver salt and a pyrrole compound, wherein said pyrrole compound is a compound represented by the following formula (I)

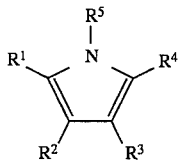

wherein $R^1$, $R^2$, $R^3$, and $R^4$ are each a substituted or unsubstituted aryl group, a substituted or unsubstituted alkyl group, an aralkyl group, an acyl group, an ester group, a nitro group, a nitrile group or a hydrogen atom; $R^5$ is a substituted or unsubstituted aryl group, a substituted or unsubstituted alkyl group, an aralkyl group, an acyl group, an ester group or a hydrogen atom; and $R^1$, $R^2$, $R^3$, $R^4$ and $R^5$ may be the same or different from one another.

2. The dry process silver salt photosensitive material according to claim 1, wherein at least one of said $R^1$, $R^2$, $R^3$ and $R^4$ is a hydroxyaryl group.

3. The dry process silver salt photosensitive material according to claim 1, wherein said pyrrole compound is selected from 2-(2-hydroxyphenyl)-5-phenylpyrrole, 2-(2-hydroxyphenyl)-3-methoxycarbonyl-5-phenylpyrrole, 2-(2-hydroxyphenyl)-5-methylpyrrole, 2-(4-hydroxyphenyl)-5-phenylpyrrole and 2-(4-hydroxyphenyl)pyrrole.

4. The dry process silver salt photosensitive material according to claim 1, wherein said photosensitive layer contains a polymerizable polymer precursor and a photopolymerization initiator.

5. The dry process silver salt photosensitive material according to claim 1, which further comprises a polymerizing layer containing a polymerizable polymer precursor and a photopolymerization initiator.

6. An image forming method comprising subjecting the dry process silver salt photosensitive material according to claim 1 to imagewise exposure and heating to form an image.

7. An image forming method comprising subjecting the dry process silver salt photosensitive material according to claim 4 to imagewise exposure, heating and polymerization exposure to form an image.

8. An image forming method comprising subjecting the dry process silver salt photosensitive material according to claim 5 to imagewise exposure, heating and polymerization exposure to form an image.

* * * * *